(12) United States Patent
Pitwon

(10) Patent No.: US 7,899,278 B2
(45) Date of Patent: Mar. 1, 2011

(54) ELECTRO-OPTICAL PRINTED CIRCUIT BOARD, A BLANK AND A METHOD OF MAKING AN ELECTRO-OPTICAL PRINTED CIRCUIT BOARD

(75) Inventor: Richard Charles Alexander Pitwon, Fareham (GB)

(73) Assignee: Xyratex Technology Limited, Havant (GB)

( * ) Notice: Subject to any disclaimer, the term of this patent is extended or adjusted under 35 U.S.C. 154(b) by 240 days.

(21) Appl. No.: 12/177,522

(22) Filed: Jul. 22, 2008

(65) Prior Publication Data

US 2009/0028496 A1    Jan. 29, 2009

Related U.S. Application Data

(60) Provisional application No. 60/952,467, filed on Jul. 27, 2007.

(51) Int. Cl.
G02B 6/12    (2006.01)
G02B 6/13    (2006.01)

(52) U.S. Cl. .......................... 385/14; 385/129; 385/147

(58) Field of Classification Search .................. 385/129
See application file for complete search history.

(56) References Cited

U.S. PATENT DOCUMENTS

| 6,863,449 | B2 * | 3/2005 | Kuhara et al. | 385/89 |
| 6,909,818 | B2 * | 6/2005 | Tsushima et al. | 385/14 |
| 2004/0005109 | A1 * | 1/2004 | Tsushima et al. | 385/14 |
| 2006/0133766 | A1 * | 6/2006 | Shelnut et al. | 385/147 |
| 2008/0285931 | A1 * | 11/2008 | Hikita | 385/129 |

\* cited by examiner

*Primary Examiner* — Michelle R Connelly Cushwa

(74) *Attorney, Agent, or Firm* — Pillsbury Winthrop Shaw Pittman LLP

(57) ABSTRACT

The invention provides a method of making an electro-optical printed circuit board, the method comprising: providing a support layer having thereon surface mounted electric components within a region of the support layer; forming one or more surface mounted optical components on the surface of the electro-optical printed circuit board; and during formation of the one or more surface mounted optical components shielding the region of the electro-optical printed circuit board where the surface mounted electric components are formed.

5 Claims, 26 Drawing Sheets

Removeable protective panel with fixed boundary and manually detachable components
Optical layer deposition with cladding mask clearout Partial curing of upper cladding layer Removeable protective panel with fixed boundary and manually detachable components
Optical layer deposition with cladding mask clearout Lid detachable to reveal uncontaminated surface structures Surface design preparation for optical layer deposition Deposition of uncured higher refractive index core layer onto partially cured lower cladding layer Patterning of core features (waveguides) while masking clear out area Lower refractive index material (uncured) deposited over cured core and lower cladding layers Partially cure upper cladding layer, masking out clear out sections with same mask used for lower cladding layer cure Positioning of manually detachable cover onto clear-out areas with mechanical boundary features fixed to the surface

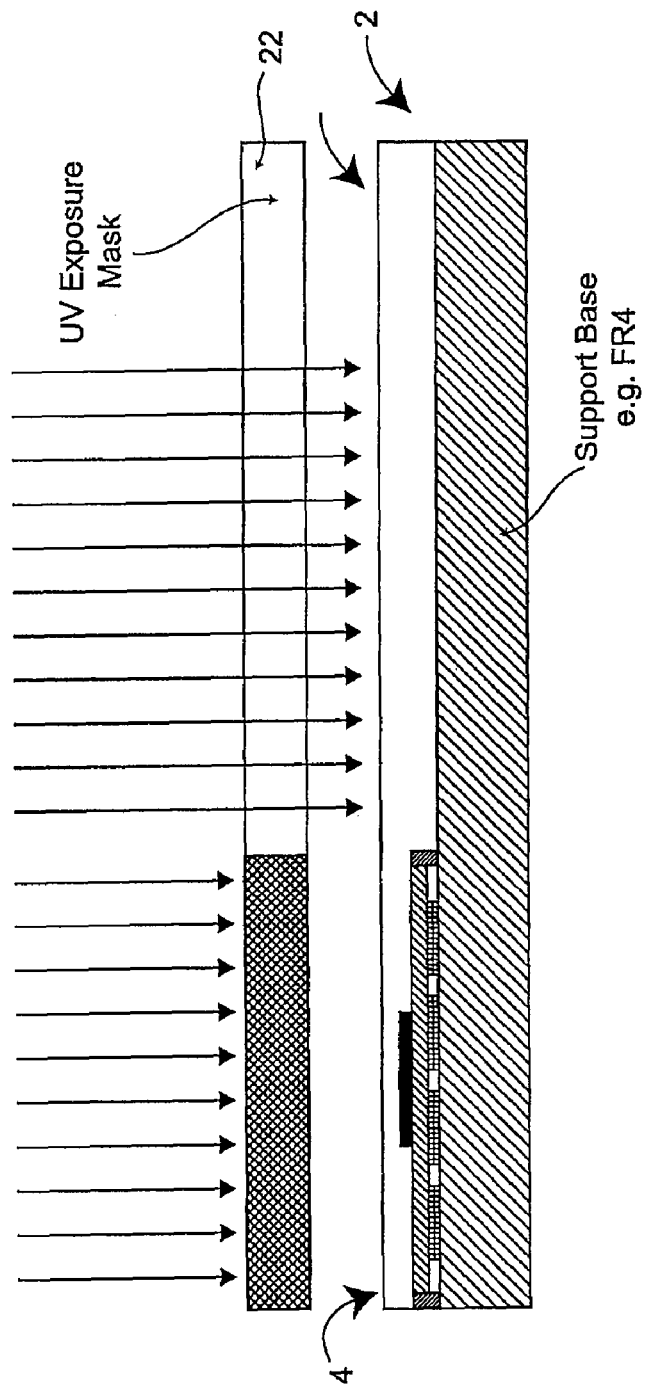

ELECTRO-OPTICAL PRINTED CIRCUIT BOARD, A BLANK AND A METHOD OF MAKING AN ELECTRO-OPTICAL PRINTED CIRCUIT BOARD

CROSS REFERENCE TO RELATED APPLICATIONS

This application claims priority to U.S. provisional application Ser. No. 60/952,467, filed Jul. 27, 2007, the entire contents of which is incorporated herein by reference.

As data rates increase across data networks, there is an increasing need for the use of technologies that can enable the high data rates to be utilised throughout the network. An example of such a technology is the use of optical waveguides and other such optical signal carriers arranged on a conventional electric printed circuit board (PCB). Such a device may be referred to as an electro-optical printed circuit board or "EOPCB".

An EOPCB contains both metal layers, e.g. copper layers, and optical layers. Naturally, such PCBs are expected to satisfy the typical functions of a conventional copper PCB, complimented by the very high speed signal carrying capacity of optical signal carriers. Typically, the surface of such PCBs would be expected to accommodate a population of conventional electrical components. The term "electrical components" includes amongst others passive components such as capacitors, resistors, electrical connectors, inductors, pads, through-holes and vias, and active components such as integrated circuits (microcontrollers, FPGAs, ASICs, EEPROMs), power regulators, and crystals. Such components may be referred to generally as electrical surface-mounted devices (SMDs).

Preferably, all the optical layers in an EOPCB are embedded within the EOPCB leaving the entire surface available for conventional electrical use. However, there are some critical applications in which at least a partial optical layer is required on the surface. For example, manual mechanisms for aligning optical connector mounts to optical waveguides require access to the optical waveguides for alignment. In such situations, it is necessary to have on the surface of the EOPCB both optical and electrical components.

According to a first aspect of the present invention, there is provided a method of making an electro-optical printed circuit board, the method comprising: providing a support layer having thereon a region for the location of surface mounted electric components; forming one or more surface mounted optical components on the surface of the electro-optical printed circuit board; and during formation of the one or more surface mounted optical components shielding the region of the electro-optical printed circuit board where the surface mounted electric components are or are to be formed.

Thus there is provided a method of making an electro-optical printed circuit board, the method comprising providing a support layer which may have thereon surface mounted electrical components within a region of the support layer; forming one or more surface mounted optical components on the surface of the electro-optical printed circuit board; and during formation of the one or more surface mounted optical components shielding the region of the electro-optical printed circuit board where the surface mounted electric components are or may be located.

A method of making an electro-optical printed circuit board is provided which is capable of accommodating features such as electrical SMDs and other surface features, such as copper pads or lands, typical to conventional PCBs during the deposition of an optical layer onto the surface of a conventional PCB as part of the fabrication process of the electro-optical PCB. Thus, a method is provided by which a region of the EOPCB is protected which thereby ensures that the application of optical material will not effect the functioning of the electrical SMDs on the EOPCB. The shielding of the region where the electrical SMDs are positioned will serve to minimise or eliminate contamination of the electrical SMDs with optical material.

In one preferred example, the step of shielding comprises forming the optical components using a layer of liquid optical polymer and exposing the layer of liquid optical polymer to curing radiation using a mask to shield the region where the one or more electrical SMDs are formed. Thus, the use of an optical mask provides a convenient and simple means by which the desired region of the surface of the EOPCB can be protected or shielded during manufacture.

In one example, the step of shielding comprises positioning on the one or more surface mounted electrical components, a removable barrier. Thus, direct shielding is used such that during manufacture of the surface mounted optical components, substantially no optical material is brought into contact with the surface mounted electrical components.

Preferably, the barrier comprises a flexible sheet which may be adhesive-backed. This provides a convenient means for shielding the desired region from the optical material. In addition, it is cheap and straightforward to use and no modification is required, for example, to existing production facilities to enable the shield to be used.

In one example, the barrier comprises a rigid structure for removal once the optical components have been formed. Thus, instead of or as well as a flexible sheet, a rigid structure may be used and positioned over the desired region during manufacture of the EOPCB.

According to a second aspect of the present invention, there is provided an electro-optical printed circuit board, comprising one or more electrical layers; and one or more optical layers, wherein on the upper surface there are provided both optical components and surface mounted electrical components, wherein the optical components are arranged within a single continuous region.

The second aspect of the invention therefore provides an electro-optical printed circuit board having surface-mounted electrical components and surface-mounted optical components. The optical components are arranged within a single continuous region thereby simplifying manufacture of the electro-optical printed circuit board and enabling the method of the first aspect of the present invention to be used.

Preferably, the surface-mounted electrical components are aggregated into a single continuous region, or as few continuous regions as possible within normal design constraints. This will enable the manufacture of the electro-optical printed circuit board to be simplified. The shielding of the region in which the surface-mounted electrical components are aggregated will be straightforward.

According to a third aspect of the present invention, there is provided an electro-optical printed circuit board, comprising: one or more electrical layers; and one or more optical layers, wherein on the upper surface of the electro-optical printed circuit board there are provided both surface-mounted electrical components and surface-mounted optical components, the optical components being formed whilst the surface-mounted electrical components are shielded.

According to a fourth aspect of the present invention, there is provided a blank for the formation of an electro-optical printed circuit board, the blank comprising: a PCB support layer having an upper surface; surface mounted electrical components formed on the upper surface of the PCB support layer; one or more clear regions on the upper surface of the PCB support layer for the formation of optical components. A barrier may be provided over the electrical components and may thus be included as part of the blank.

Thus, in this aspect the invention provides a blank which may be used to form an EOPCB according to the second and third aspects of the present invention. The blank comprises a PCB support with various surface mounted electrical components arranged thereon. Clear regions are provided on the upper surface for the formation of optical components such that, when the optical regions are formed, the resultant structure will be an EOPCB having both surface-mounted electrical components and surface-mounted optical components. The provision of a barrier enables the optical regions to be formed without contamination of the surface mounted electrical components with optical material.

It will be appreciated that the upper surface of the PCB support could be the upper surface of a known PCB support material such as FR4 or the upper surface of a PCB having other layers, electrical or otherwise, already formed on the actual PCB support.

Preferably, the barrier comprises a sheet removably mounted on the PCB support to enclose the surface mounted electrical components. By enclosing the surface mounted electrical components it does not matter if they then come into contact with optical material, either cured or uncured, since once the sheet is removed the surface mounted electrical components will again be exposed for normal use.

Preferably the sheet is a flexible sheet. More preferably the flexible sheet is adhesive backed. This means that a user can simply attach or remove the sheet during manufacture of an EOPCB without the use of complex machinery or systems.

In one embodiment, the barrier comprises an optical mask in covering relation to the surface mounted optical components. Thus some clearance may be provided between the upper surface of the surface mounted optical components and the mask. This is envisaged for use when a liquid optical material is to be provided on the upper surface of the blank for the formation of an optical layer. The mask then serves to shield the optical material from exposing radiation and thereby ensuring that the electrical components do not come into contact with cured optical material.

Preferably, the electrical components are arranged in as few continuous regions as possible. In addition it is preferred that there are as few as possible "clear out" regions (regions left blank for the formation of optical components). In other words, the surface mounted electrical components and the clear out regions are arranged to be as simple as possible in shape so as to simplify the design and manufacture of the EOPCBs. Such an arrangement can be achieved by aggregating the electrical and/or the optical components during the design stage of the EOPCB.

Examples of embodiments of the present invention will now be described in detail with reference to the accompanying drawings, in which:

FIGS. 3A to 3L show the steps in the manufacture of a hybrid electro-optic printed circuit board.

Figure 1:
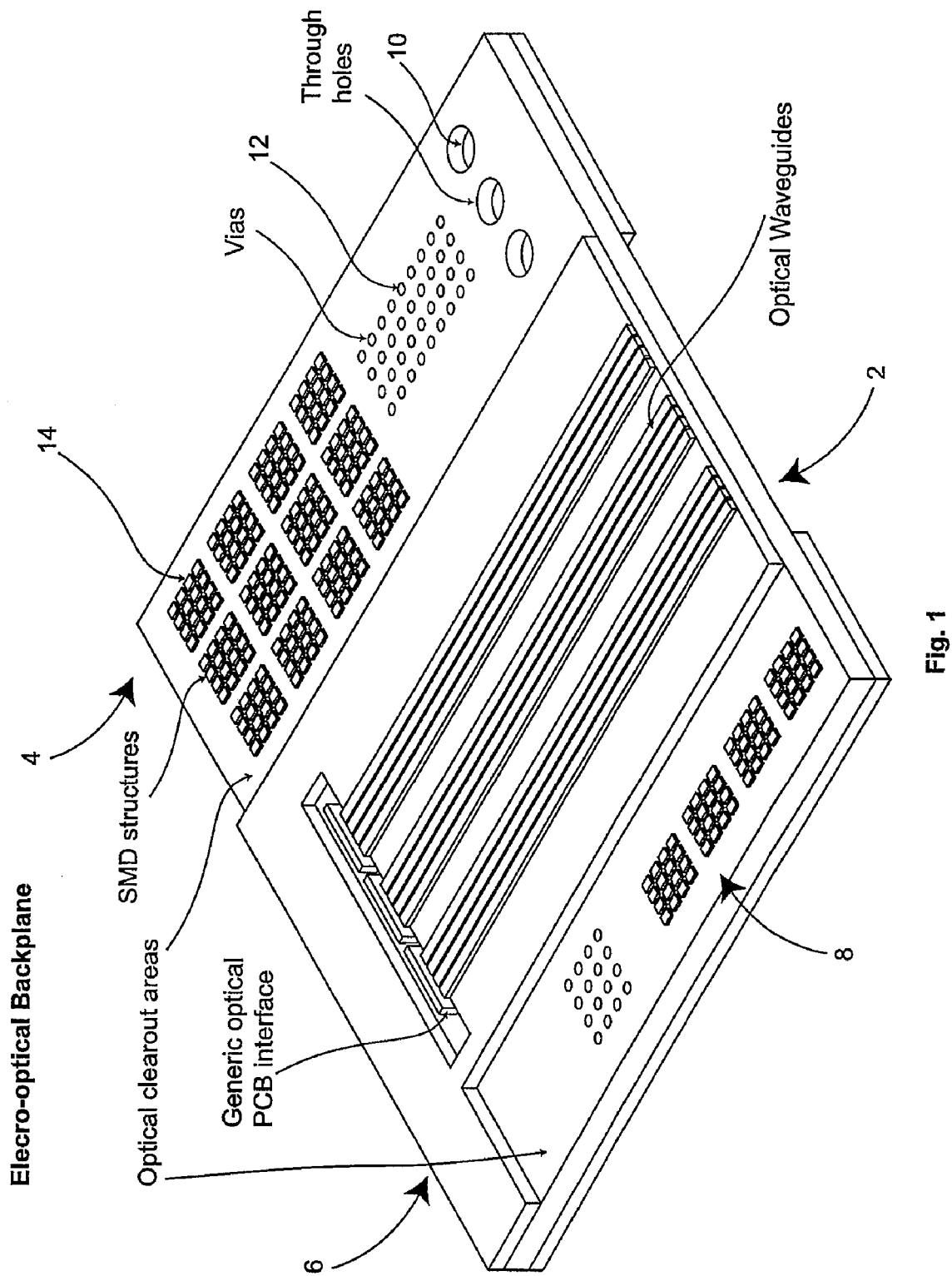
FIG. 1 shows a schematic perspective view of a hybrid electro-optic printed circuit board containing an optical layer on at least one of its surfaces.

FIG. 1 shows a schematic representation of an electro-optic PCB (hereinafter referred to as EOPCB). The EOPCB 2 has a first region 4 on which a number of electrical components or connectors are provided. A second region 6 of the EOPCB 2 is made up of optical waveguides mounted on the upper surface of the EOPCB 2. "Upper" refers to the outer exposed surface and is not limited to the specific configuration or arrangement of the EOPCB. In this example, a third region 8 is also provided for electrical components to be arranged thereon. The first region 4 of the EOPCB 2 has a number of conventional surface interface structures. In the example shown, there are provided mechanical through-holes 10, vias 12 and various surface mounted device (SMD) structures 14.

The EOPCB 2 has an optical region 6 on its upper surface. The optical region includes optical waveguides 16. It can be seen that the region 6 of the upper surface of the EOPCB 2 provides the optical functionality of the EOPCB, whereas the electrical regions 4 and 8, populated by the electrical SMDs both serve to provide the electrical functionality or interface to the electrical functionality of the EOPCB. In this example, the optical region 6 is a single continuous optical region. Such an arrangement ensures that manufacture can be simplified. Simple masks may be used to define the optical region and therefore errors in manufacture are minimised.

In this example there are two electrical regions 4 and 8. The number of discrete electrical regions is kept to a minimum so as to simplify manufacture whilst still providing the benefits of having surface-mounted electrical and surface-mounted optical components. Both the electrical and the optical surface-mounted components are aggregated into as few regions as possible thus simplifying the manufacture of the EOPCB. Such aggregation can be performed during design of the circuit board. Preferably the regions for the formation of optical components or in which the surface mounted electrical components are positioned are simple in shape, e.g. polygonal, circular, oval, square, rectangular etc or a combination of these shapes.

As will be explained below, the EOPCB is manufactured using a series of steps by which the electrical SMD structures 14 on the regions where they are located are protected from contamination with optical material whilst still enabling the formation of optical components on what is basically the same surface. In one example, the SMD structures 14 are protected using a photo-lithographic process of masking out "clear-out" regions of the surface, i.e. those regions of the surface explicitly reserved for conventional surface interface or "SMD" structures, when curing the core and cladding layers of the surface optical layer.

In another preferred example, a protective barrier, e.g. a lid, panel or sheet of some sort is used to shield the electrical SMDs 14 from contamination during the optical layer fabrication process. The protective barrier is then removed after the optical layer has been formed. Thus, the SMD structures 14 are again protected from contamination with an optical material whilst ensuring the positioning on the surface of the EOPCB 2 of both electrical and optical components.

Figure 2A:
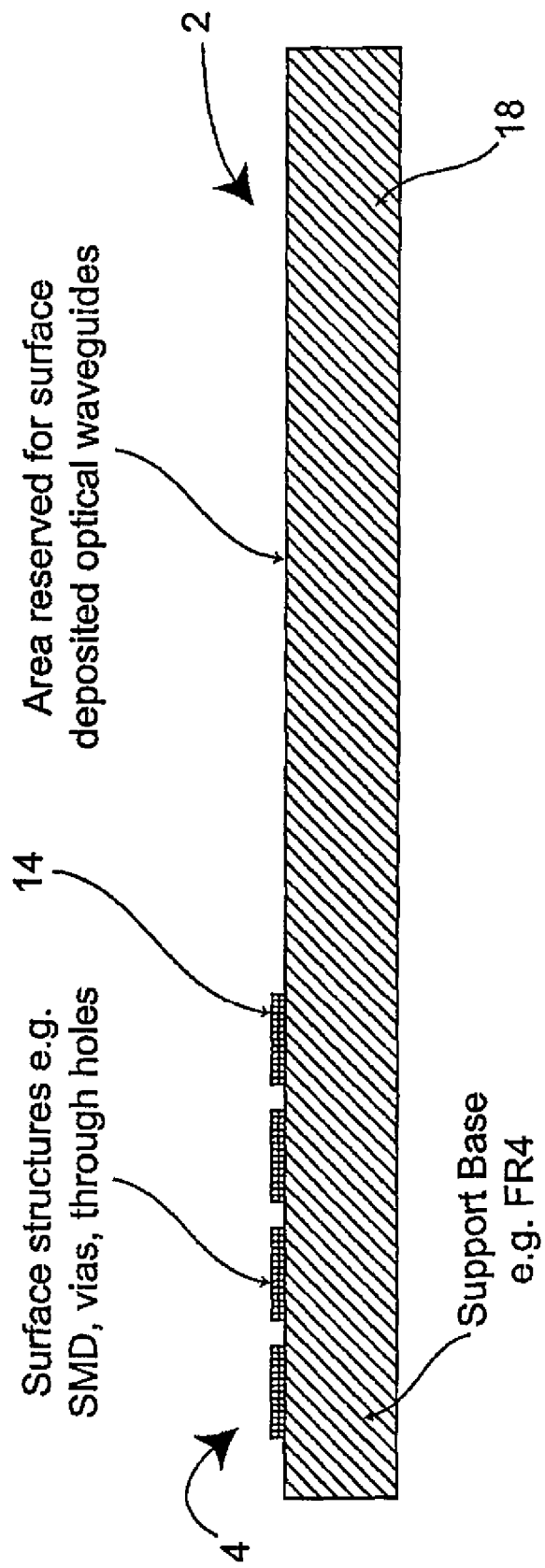
FIGS. 2A to 2I show the steps in the manufacture of a hybrid electro-optic printed circuit board.
Figure 2B:
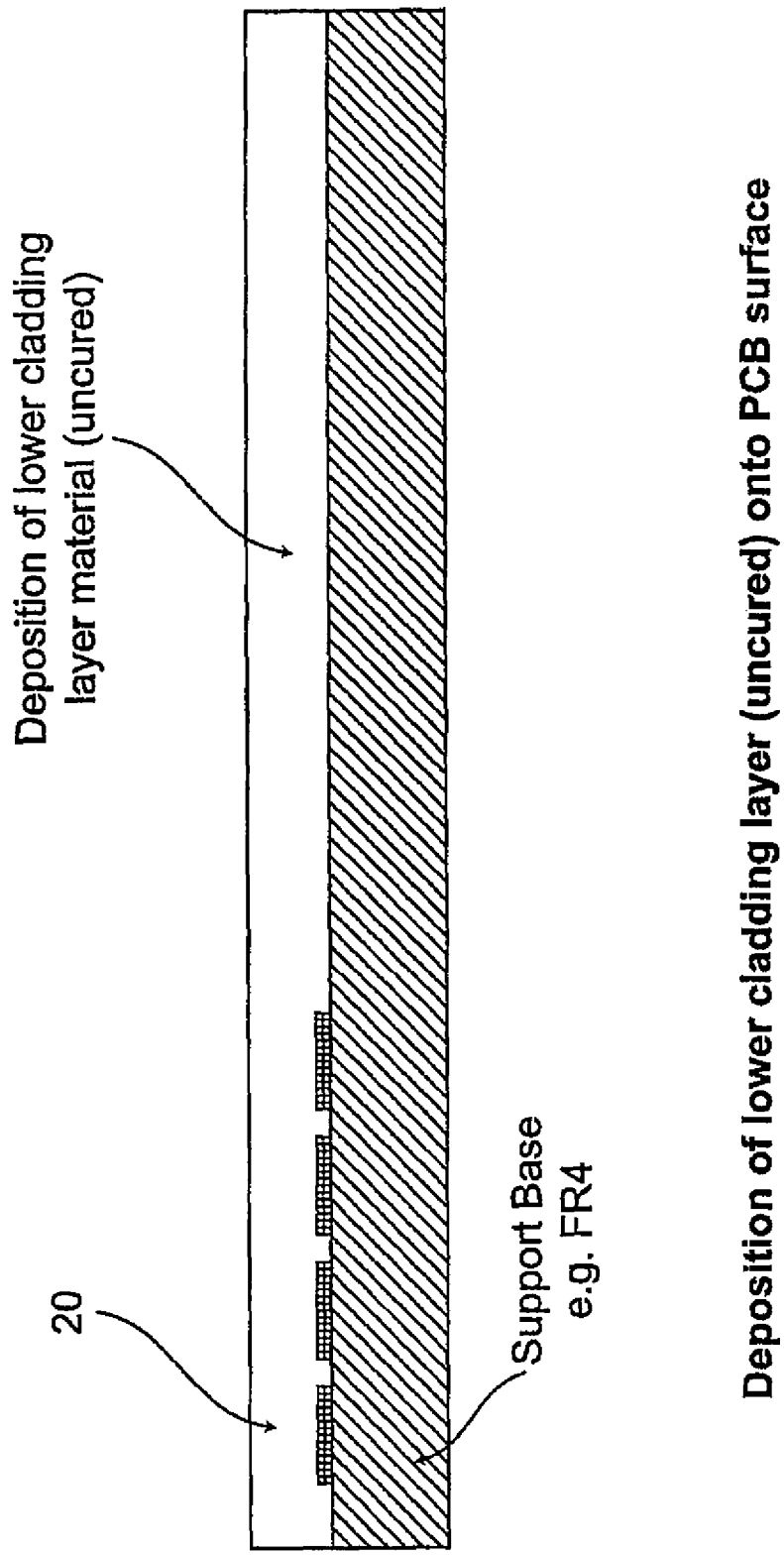

FIGS. 2A to 2I show schematic representations of the steps in a method for manufacturing an EOPCB. As shown in FIG. 2A, the process can start with a conventional PCB surface having undergone various known steps. For example, typically to create a conventional electrical PCB, copper patterning is performed to create traces, copper pads and lands, which can form the surface interface structures or SMDs 14.

Next, drilling may be performed to create through-holes or vias. This step cannot be performed after deposition of a surface optical layer as surface alignment marks typically used by the drill mount will not be distinguishable. Next conductor plating and coating is performed whereby the pads and lands are coated with solder. Next, deposition of solder resist to prevent short circuits between non-surface interface structures is typically performed. Last, silk screen deposition may be used to display text or shapes where necessary. Of course, these process steps are known and are merely given as a particular example of the steps by which a conventional electrical PCB may be manufactured.

All the steps are preferably taken before deposition of the optical surface layer as the added thickness of the layers and resulting visual distortion of the underlying surface may make it difficult to attempt after the optical layers have been deposited.

Areas of the EOPCB containing exposed pads, lands, vias or other surface interface structures 14 must be accessible after deposition of the surface optical layer. To achieve this, these are arranged into so called "clear-out" or "access" regions. Regions not requiring population by electrical SMDs or not required to provide access to underlying electrical features will be available for optical layer features. It will be at the discretion of the designer to determine an effective and economic means of arranging or aggregating the electrical SMDs 14 and indeed the surface-mounted optical components, for example in a modular fashion, to minimise the number of separate clear-out regions and simplify their shape.

FIG. 2A shows a section through an EOPCB 2 which has not yet had formed on it any optical components. The EOPCB 2 comprises a support base 18 which may be made of any suitable PCB support material. One example is FR4. A region 4 is provided in which SMD components 14 are positioned.

Next, a layer of uncured lower cladding optical material, such as a polymer, is deposited upon the entire exposed upper surface of the EOPCB 2. The lower cladding material 20 is liquid in its uncured state.

Figure 2C:
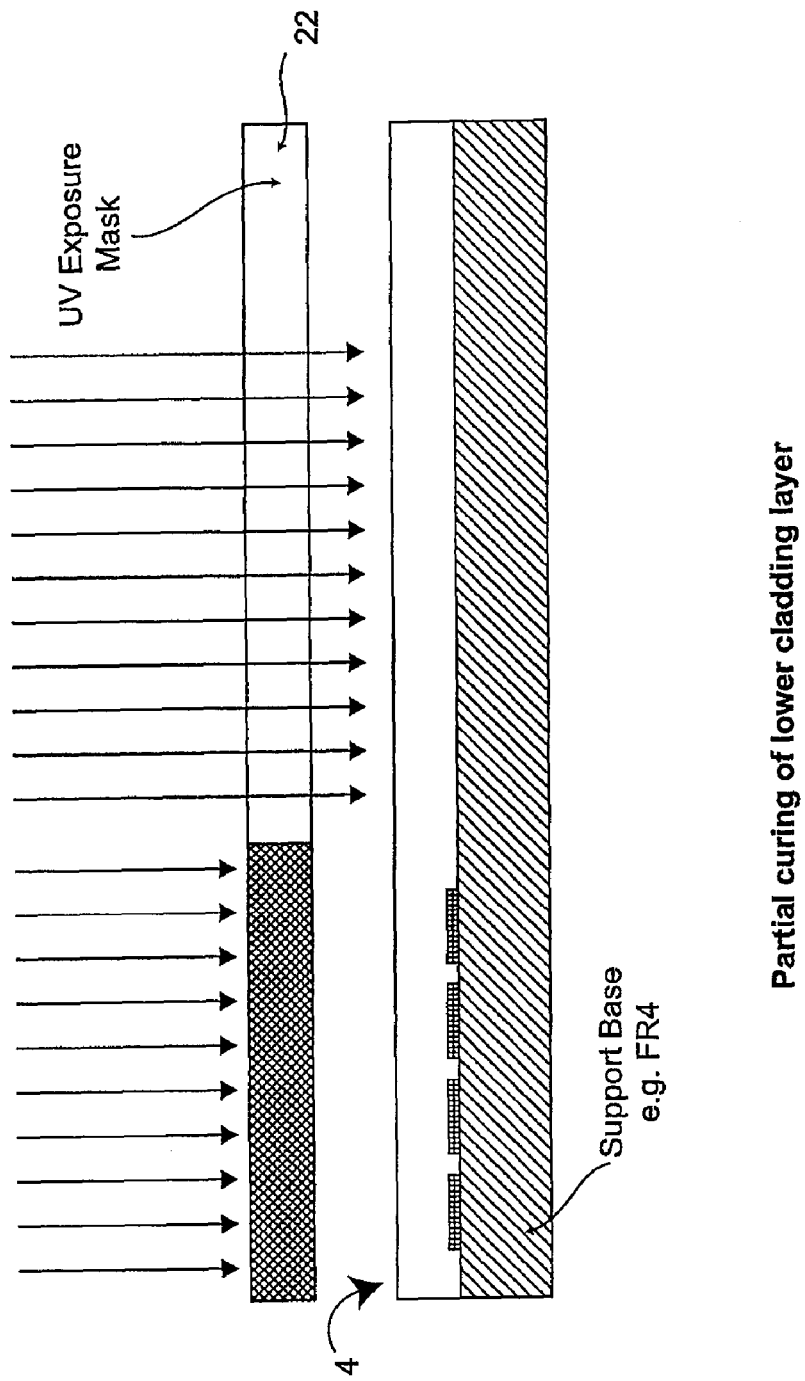

Next, as shown in FIG. 2C, an exposure mask is arranged in covering relation to the EOPCB 2. The mask 22 defines the region 4 on the EOPCB 2 which is protected from UV exposure. Thus, after the structure has been irradiated through the mask with radiation such as ultraviolet radiation, the region 4 which is shielded experiences no curing effect and therefore the optical material in this region 4 can simply be washed away. The optical mask has shielded, in this case indirectly, the region 4 where the electrical SMDs are formed. In a preferred example, the mask is shaped to define a single continuous region for the formation of optical components and also preferably a single continuous region for electrical components.

Figure 2D:
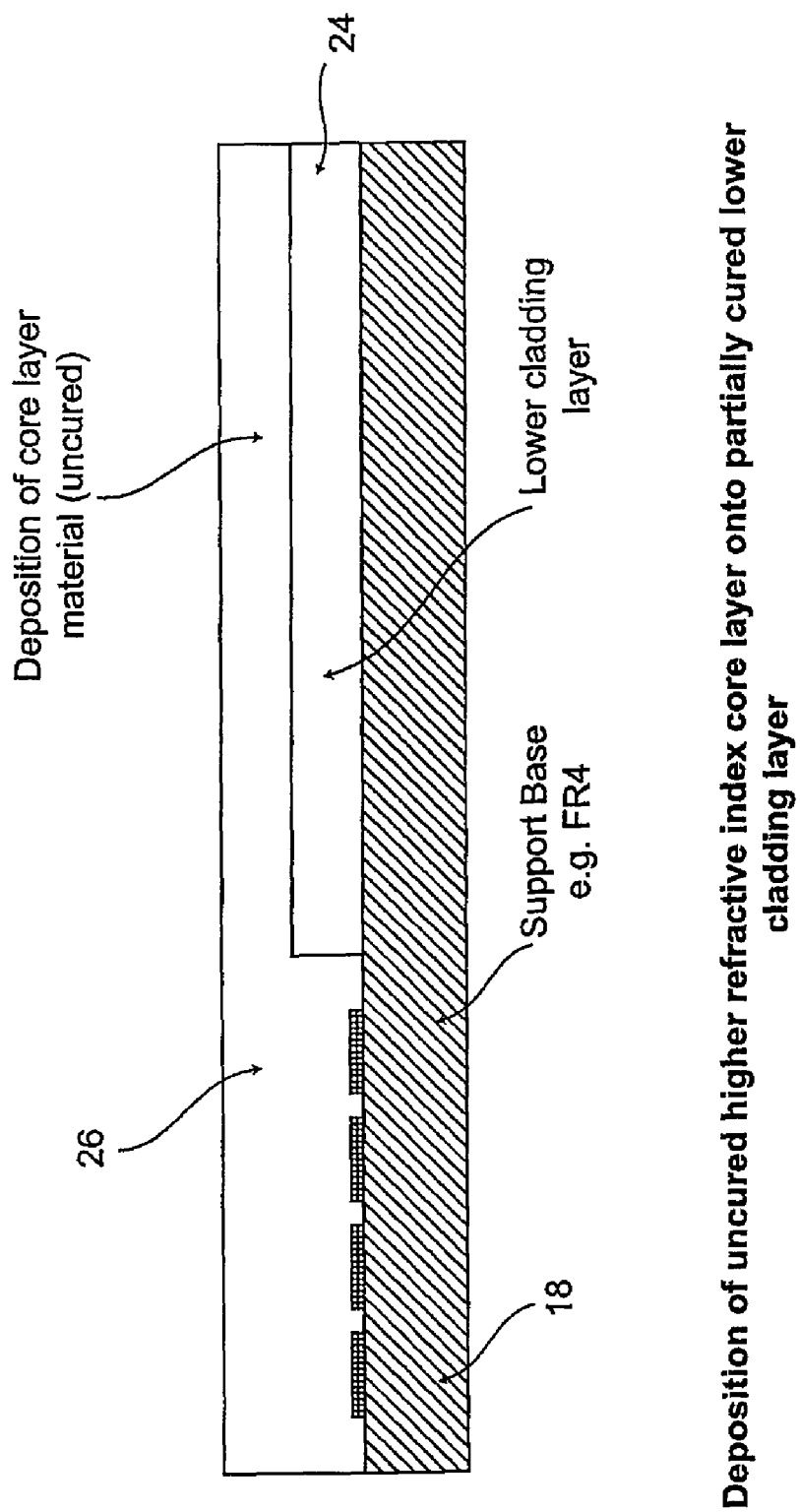

Referring to FIG. 2D, a cured region 24 of lower cladding is formed as a result of the exposure through the mask 22. Next, a layer of uncured core optical material is arranged over the resultant structure. The core layer is deposited such that its upper surface is at a substantially constant separation from the upper surface of the FR4 base 18, i.e. although its depth varies it presents a substantially uniform or planar upper surface.

Figure 2E:
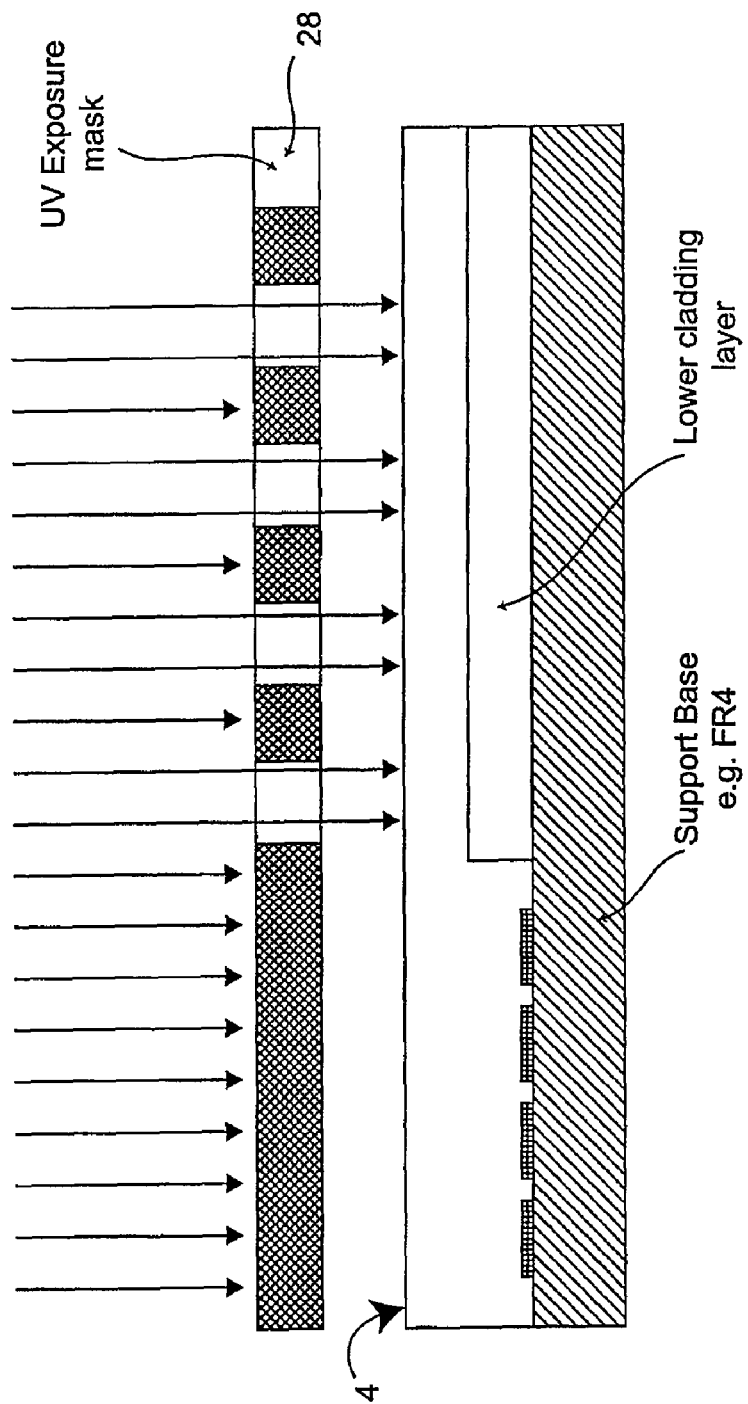
Figure 2F:
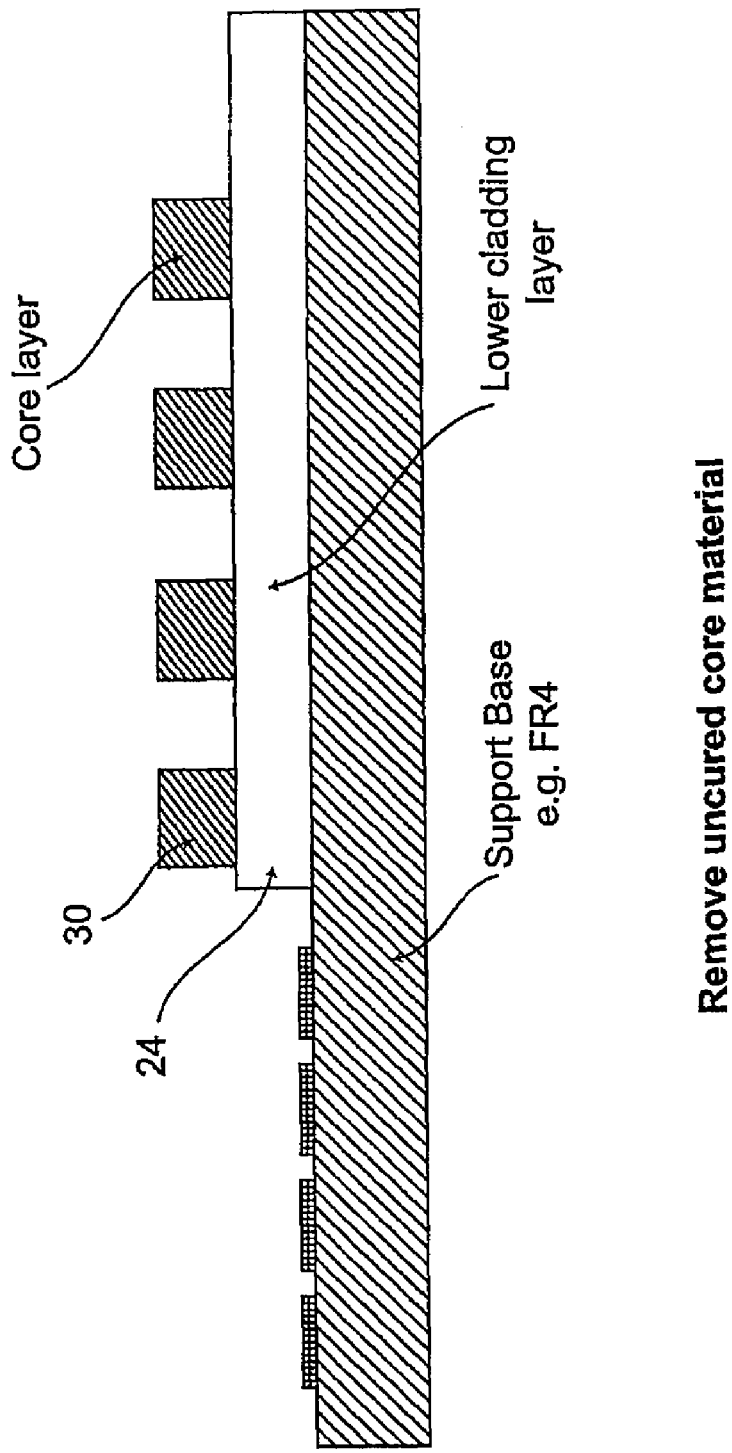
Figure 2G:
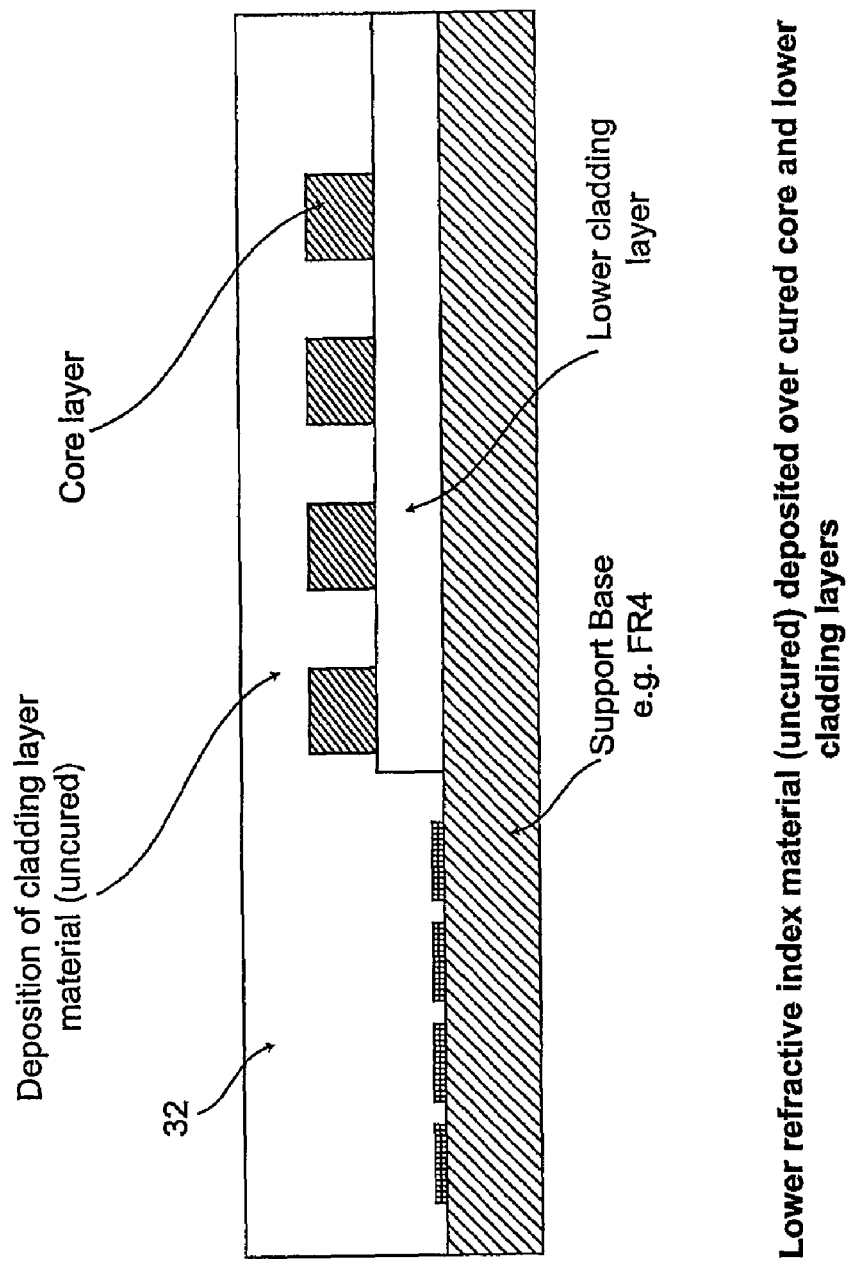

Next, as shown in FIG. 2E, a second exposure mask 28 is arranged in covering relation to the resultant structure and is irradiated with radiation such as UV radiation. Again, as with the first mask 22, the region 4 is shielded from the radiation such that there is no curing of the core material within this region 4. Thus, as can be seen in FIG. 2F, the uncured core optical material can be washed away from the cured structure thereby leaving a number of formed waveguide cores 30 on top of the lower cladding layer 24 and no optical material in the clear-out region 4. Next, a layer of cladding material is arranged over the entire resultant structure such that the entire structure is covered with the uncured cladding material 32.

Figure 2H:
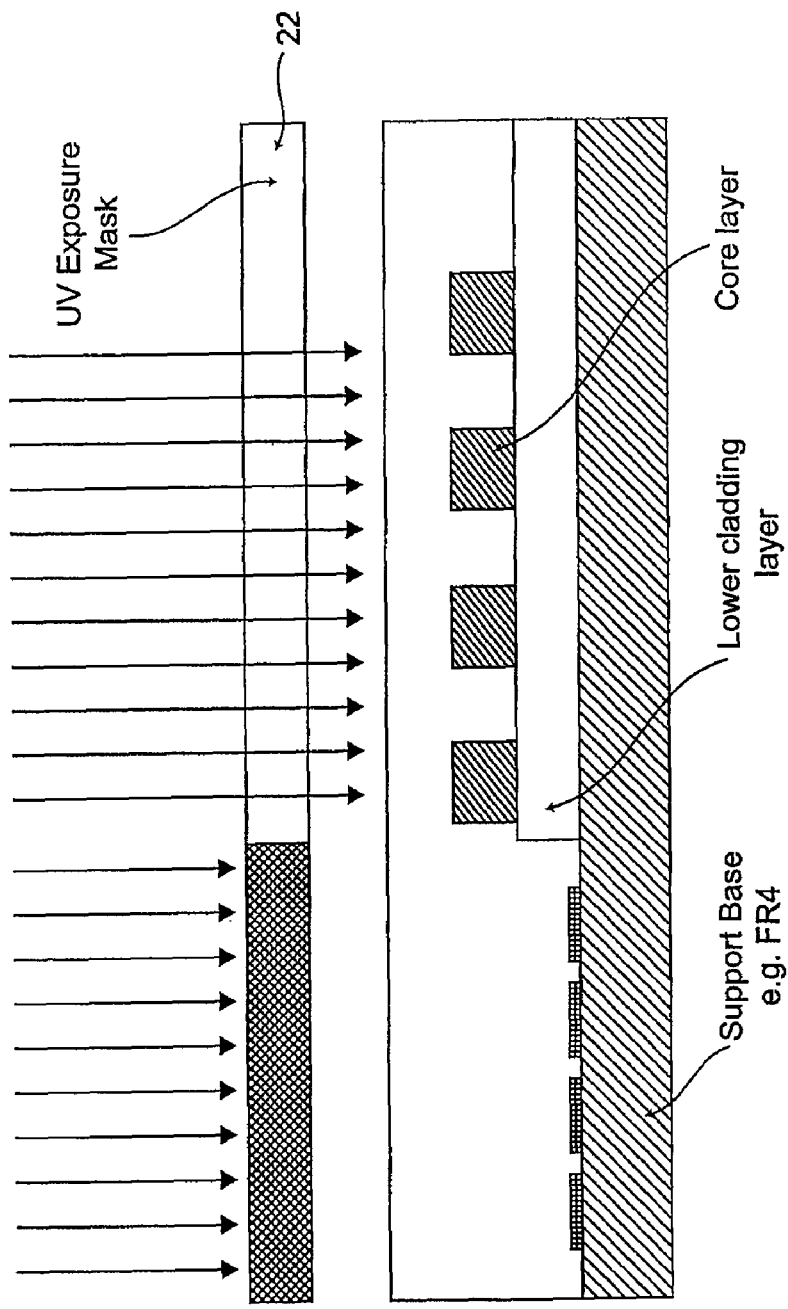

Next, as shown in FIG. 2H, an exposure mask is again arranged in covering relation to the resultant structure and irradiated with UV radiation. The mask used may be identical to that used in step 2C such that the pattern of the upper cladding corresponds identically to that of the lower cladding.

Figure 2I:
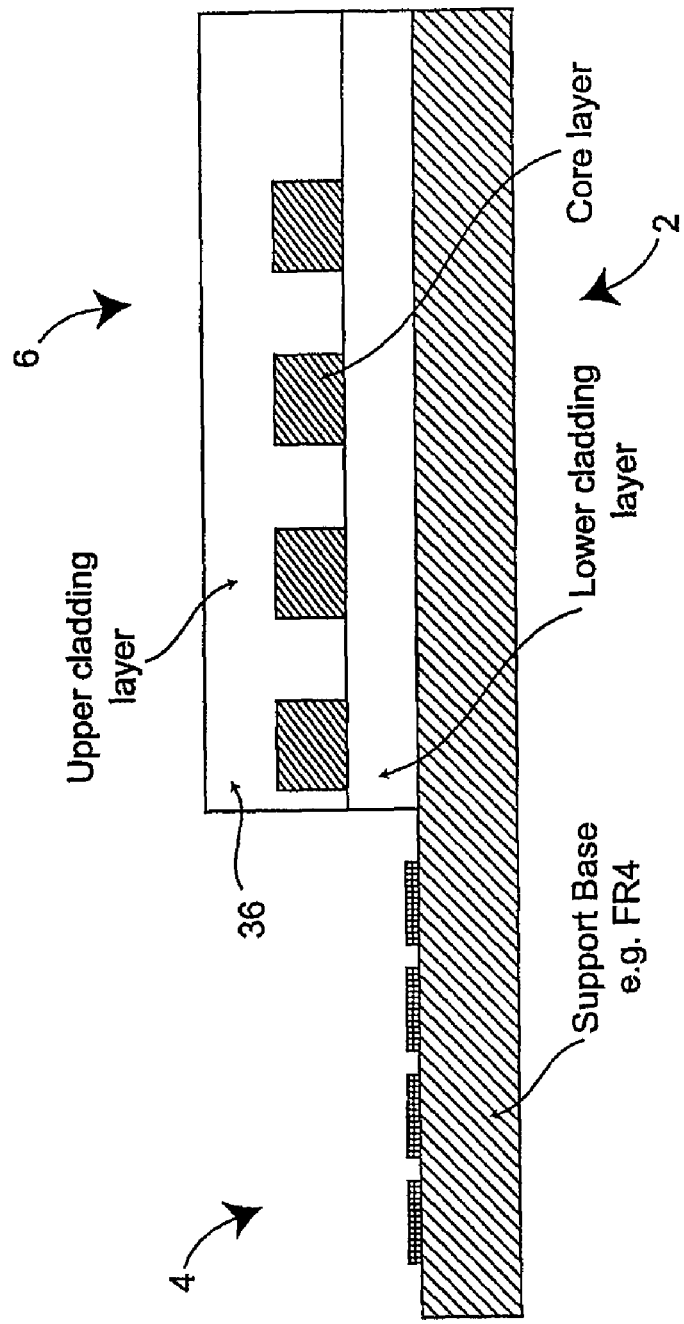

As shown in FIG. 2I, the resultant structure is that a region 4 remains uncontaminated by the optical material whereas the region 6 is complete in that all the necessary layers and structures have been formed so that a number of waveguides 36 are now suitably arranged on the EOPCB 2.

Thus, the method provides a way of making an EOPCB 2 in which during formation of one or more surface mounted optical components, in this case the waveguide 36, a region 4 of the EOPCB 2 is shielded in such a way that the surface mounted electrical devices 14 are effectively protected from contamination by the optical material. Whilst they might well come into contact with optical materials during the formation steps, due to the protection provided by the masks in the example described above with reference to FIGS. 2A to 2I, the optical material will not become attached to the electrical components and therefore contamination is avoided.

Figure 3A:
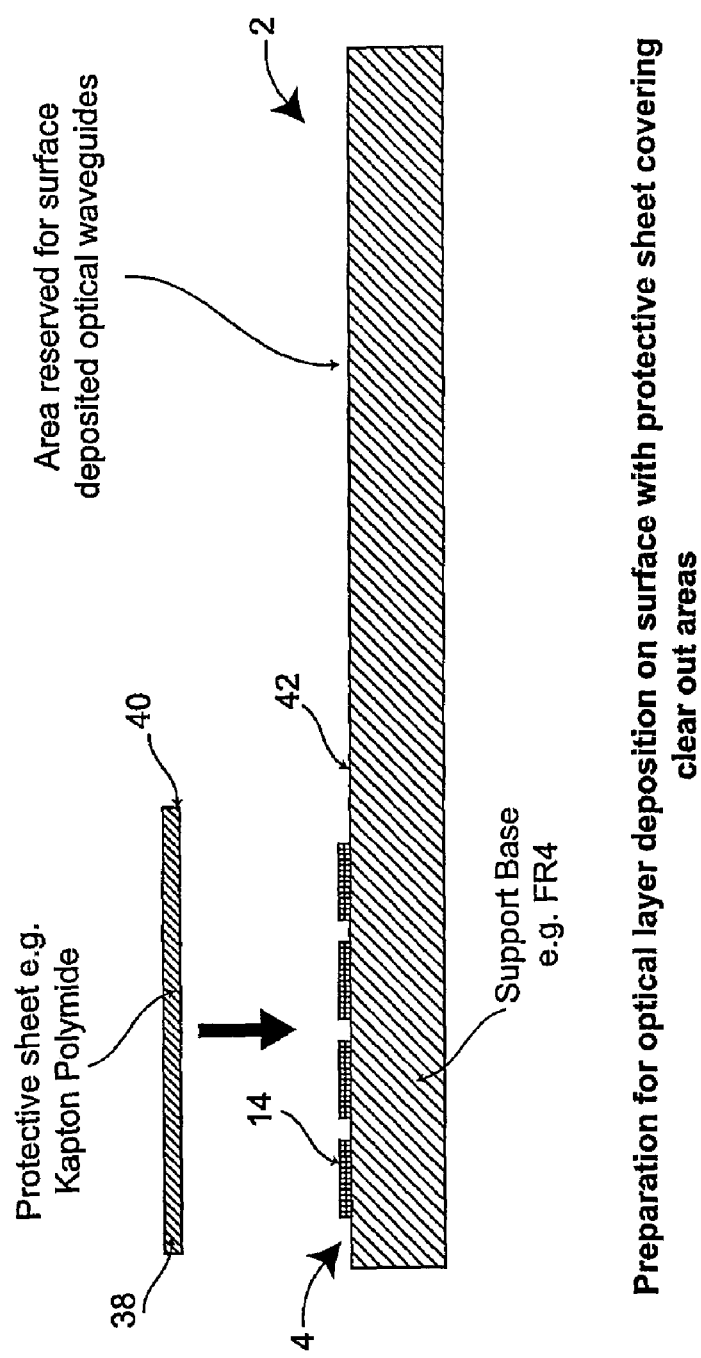

FIGS. 3A to 3L show the steps in another method of making an EOPCB 2. In this example, as shown in FIG. 3A, as a first step after formation of the surface mounted electrical component, a barrier 38 is arranged over the electrical components. The barrier 38 in this example is a protective sheet made of a material such as Kapton polyimide. In fact, any suitable material can be used to form a barrier over the surface mounted electrical components.

The electrical SMD components 14 are, like in the example described above with reference to FIGS. 2A to 2I, formed in a region 4 of the EOPCB 2. The sheet 38 is preferably flexible such that the edges 40 of it can be forced into contact with the surface 42 of the FR4 base. Thus, this will ensure that the surface-mounted electric components 14 are completely enclosed and therefore protected from exposure to any optical material.

Figure 3B:
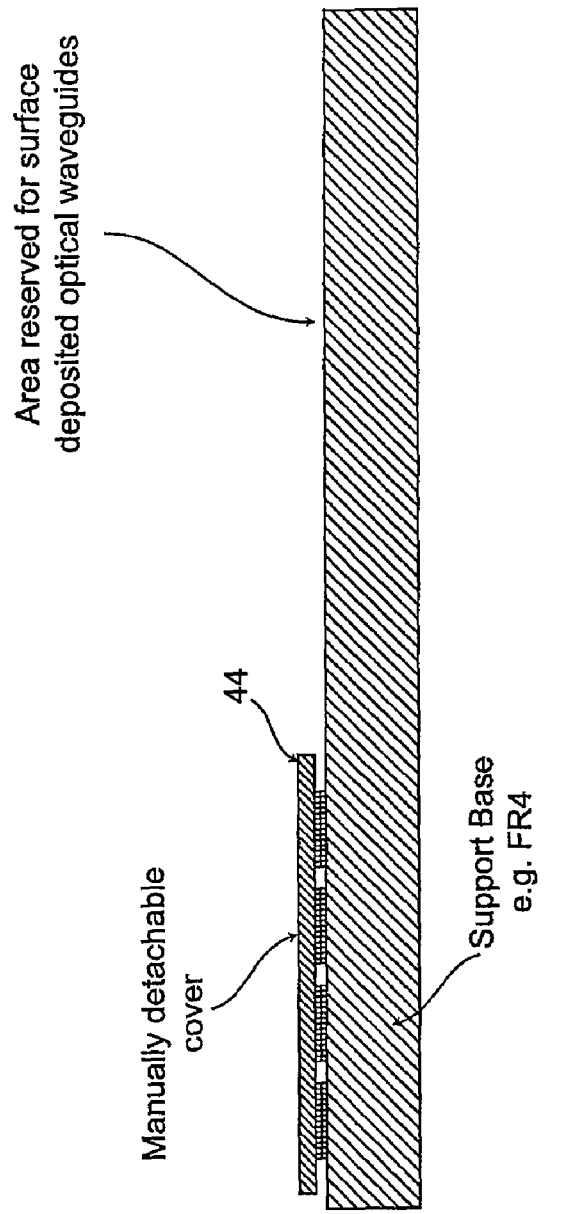
Figure 3C:
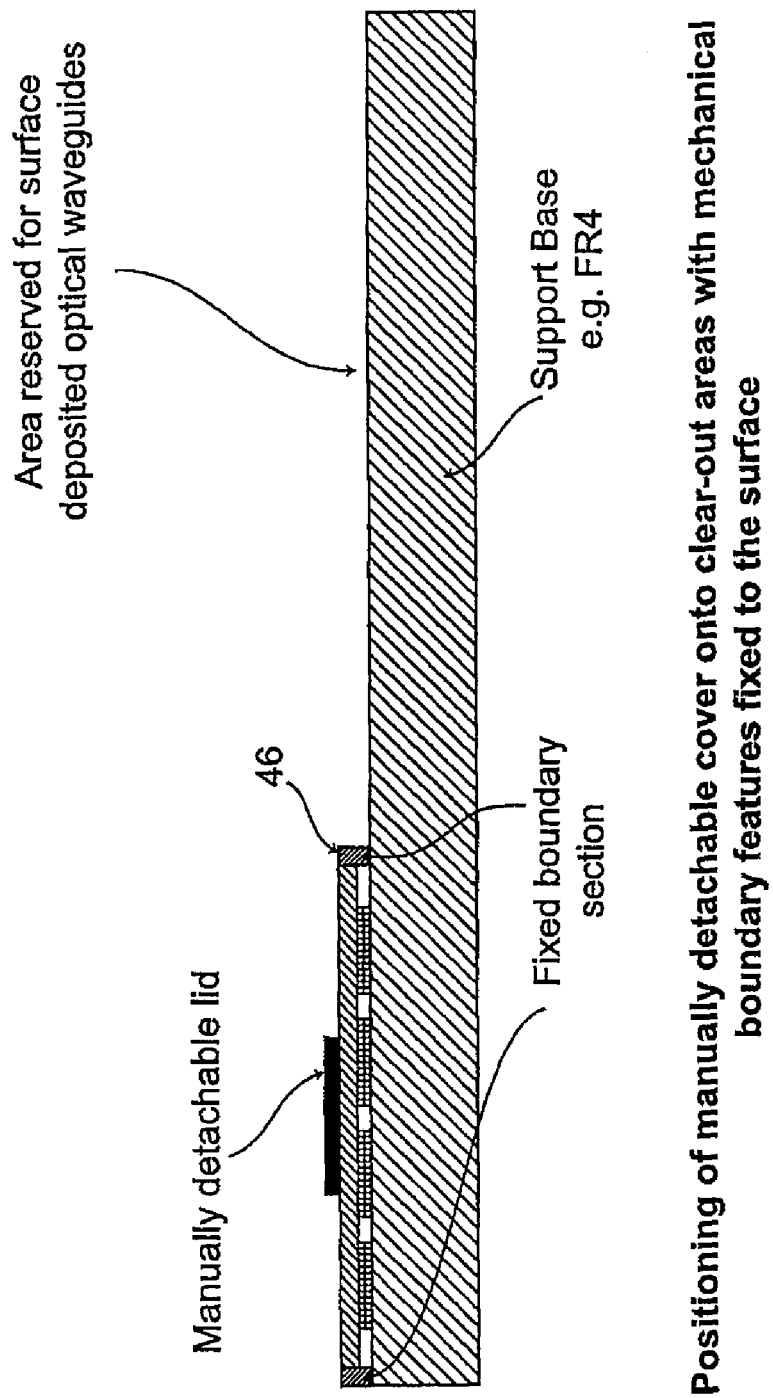

In FIGS. 3B and 3C, an alternative embodiment is shown in which the cover 38 comprises a manually detachable cover 44 together with fixed boundary sections 46. Again, the effect is that the surface mounted electric components remain protected from exposure to optical material.

Figure 3D:
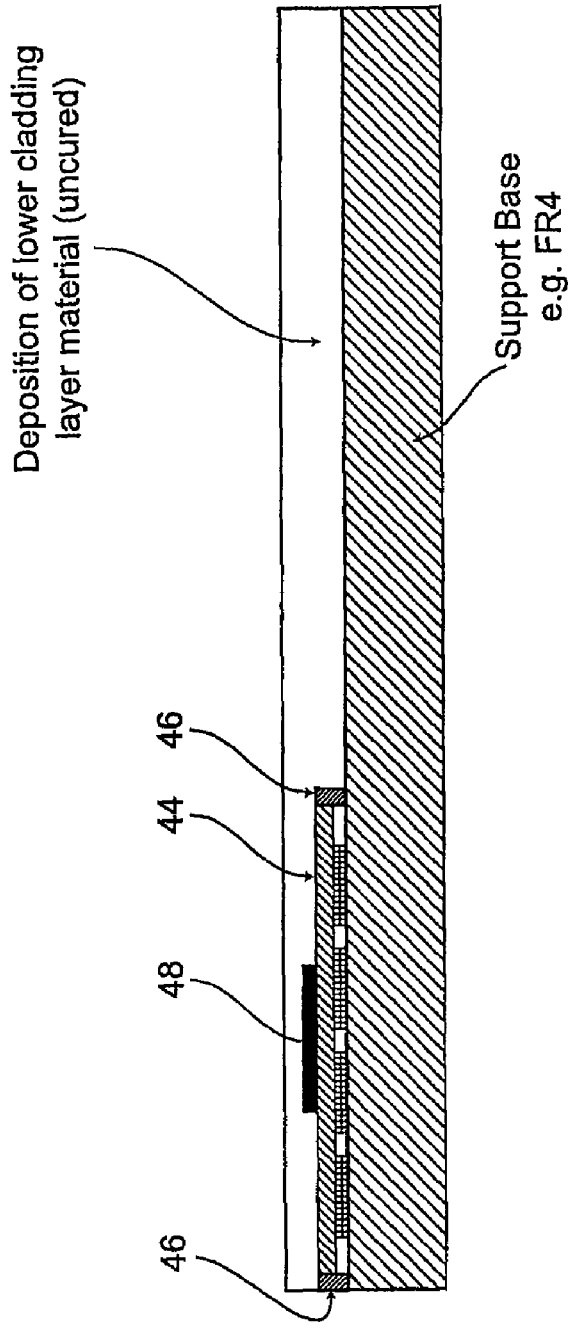
Figure 3F:
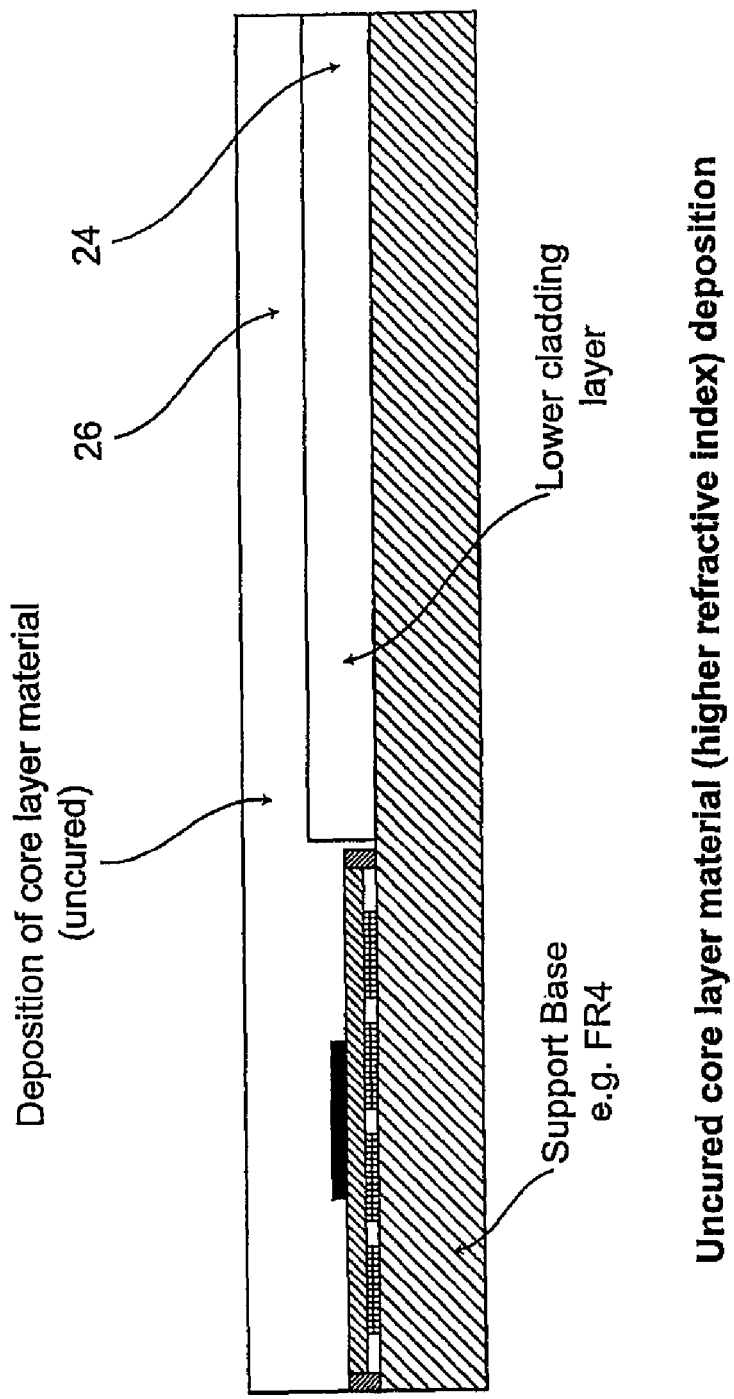

Referring to FIG. 3D, an example is shown in which the electrical SMDs 14 are protected from the optical material by a manually detachable cover 44 and fixed boundary sections 46. In addition, a handle, or other such suitable means 48, is provided for manual engagement with the lid 44. In FIG. 3D, a layer of uncured lower cladding material is arranged over the entire surface of the structure. Next, as shown in FIG. 3E, a mask 22 is provided through which ultraviolet radiation is directed onto the EOPCB 2. Once the lower cladding layer 24 has cured, the uncured material in the region 4 is removed, e.g. by washing, and then, as shown in FIG. 3F, core layer material 26 is deposited on the resultant structure.

Figure 3G:
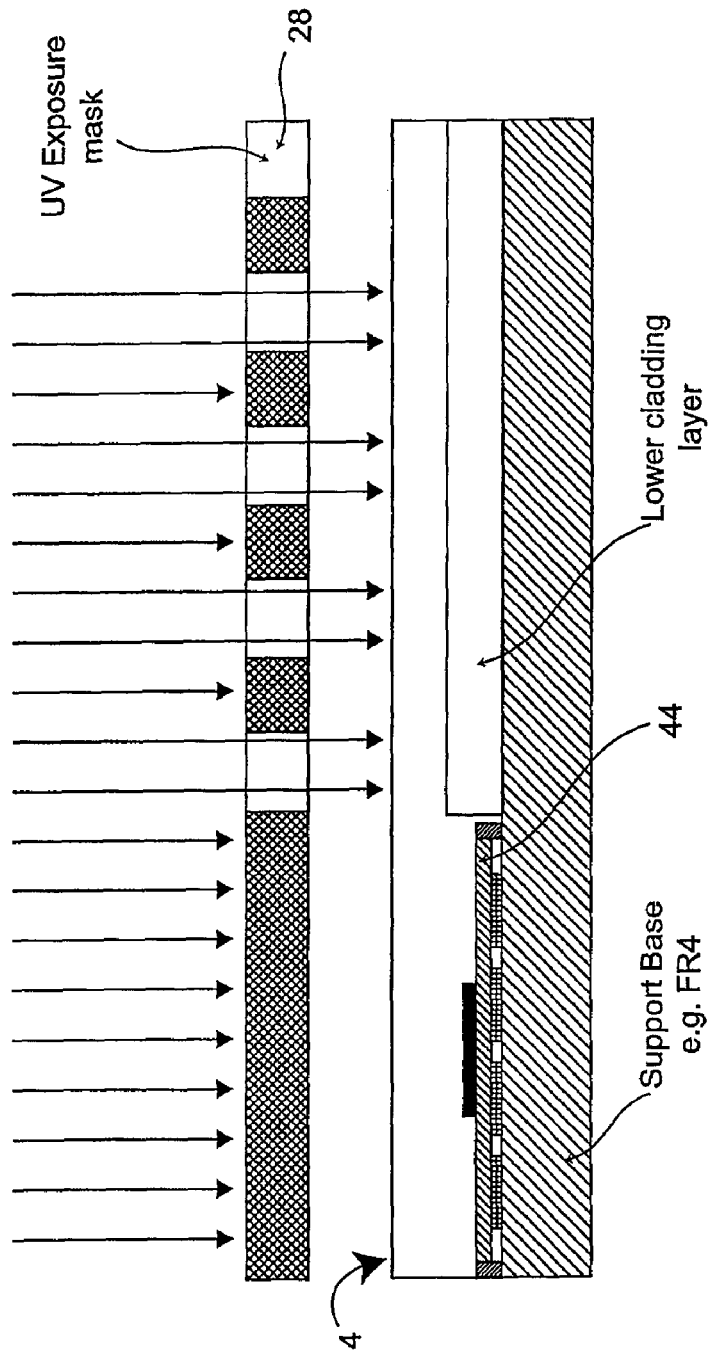
Figure 3H:
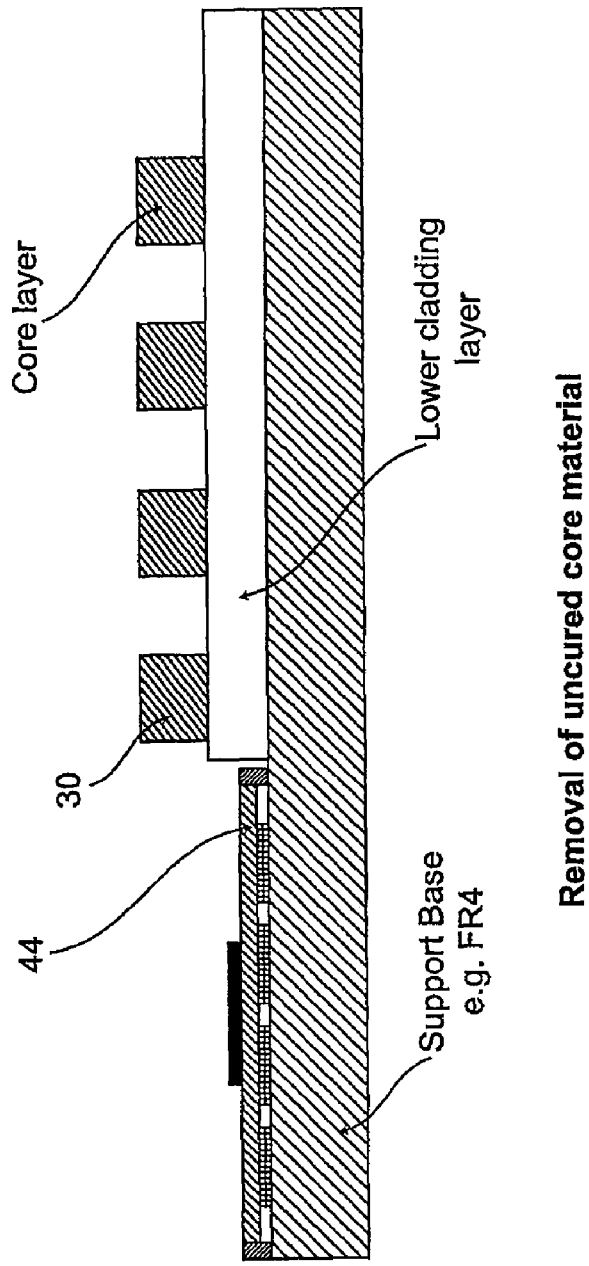
Figure 31:
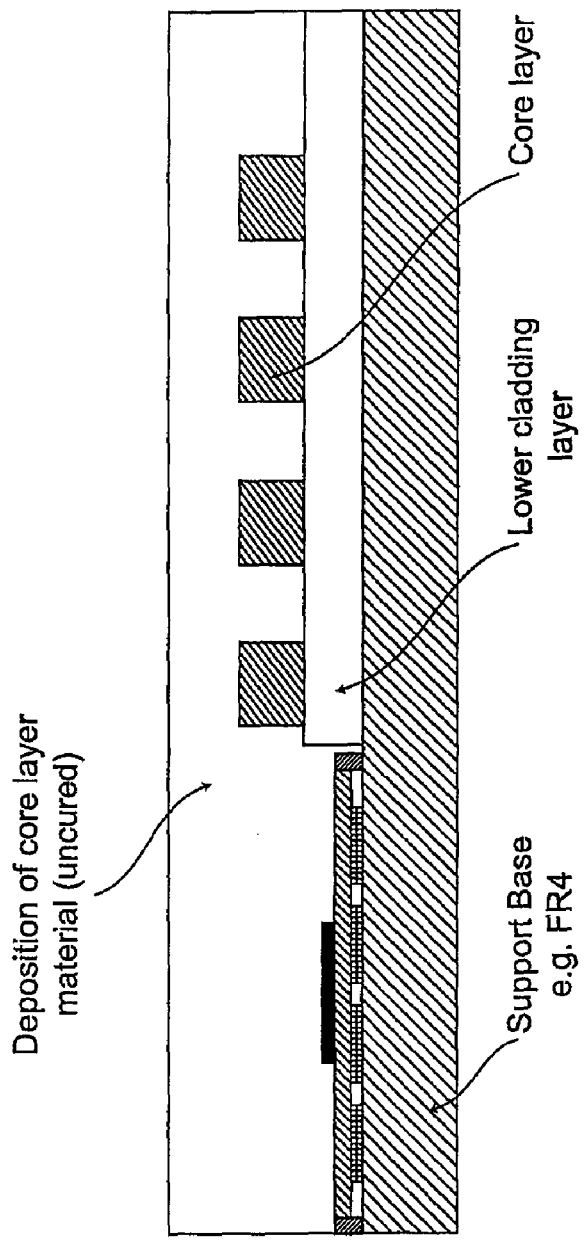

As shown in FIG. 3G, a further mask 28 is used and the resultant structure is exposed with ultraviolet radiation through the further mask 28 such that the waveguide cores 30 are formed. Again, since the region 4 is protected from exposure to the UV radiation by virtue of the mask 28, the uncured core material can be simply removed leaving exposed the manually detachable cover 44.

Figure 3J:
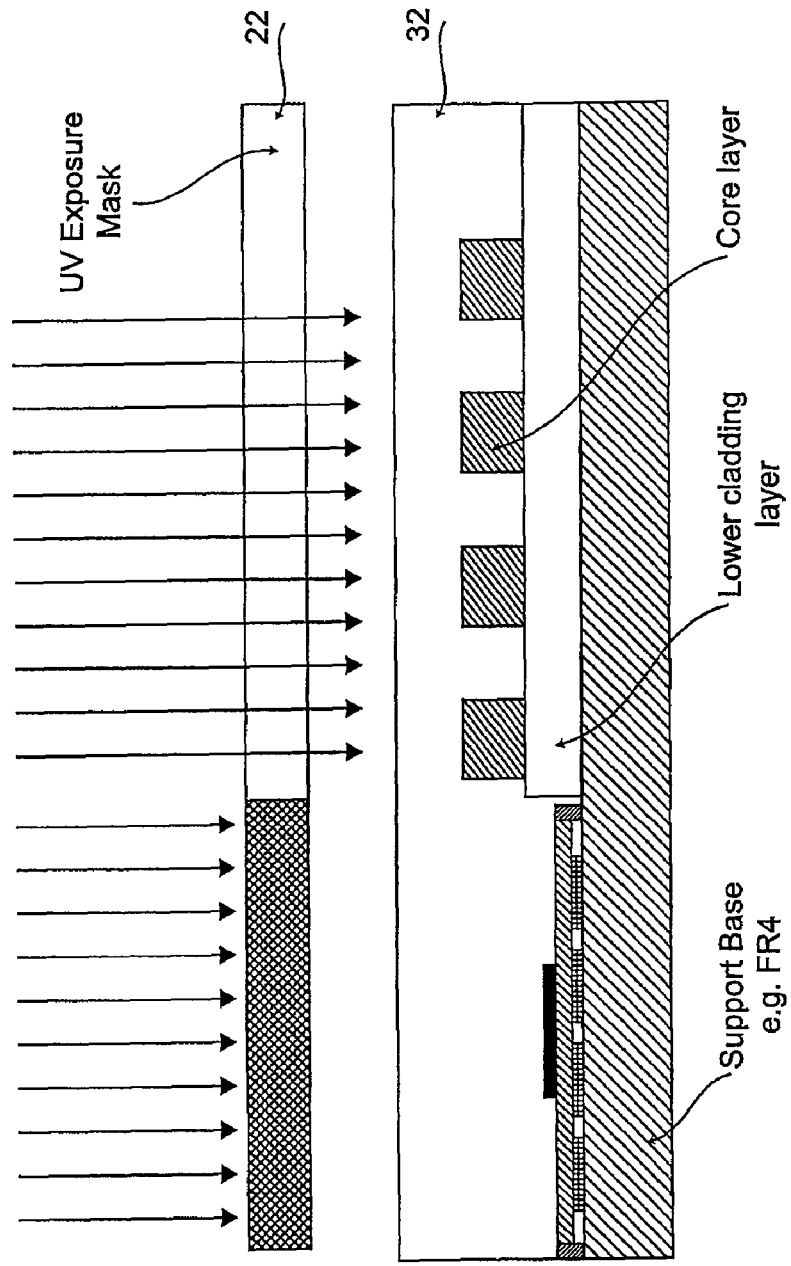
Figure 3K:
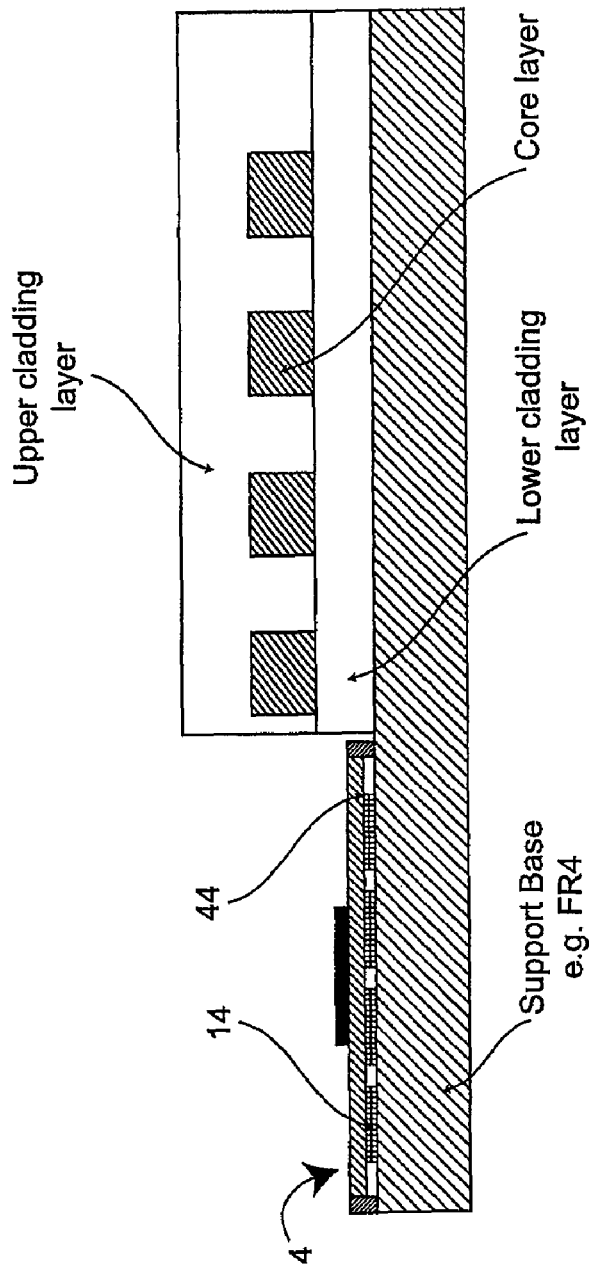
Figure 3L:
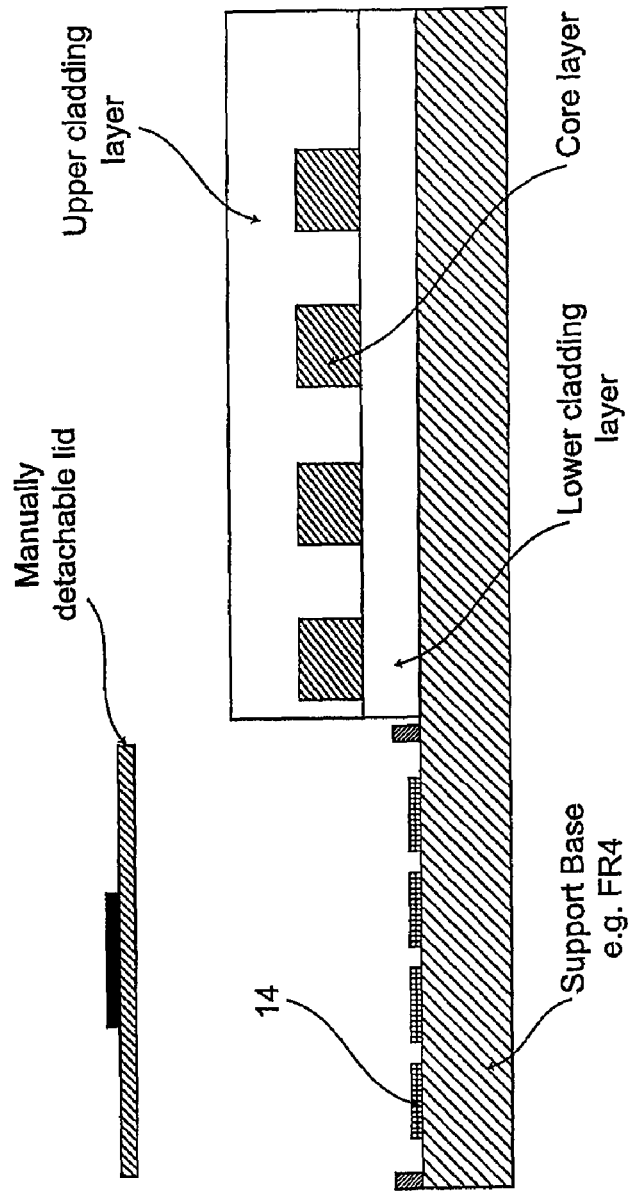

Next, as shown in FIGS. 3I and 3J, the material forming the upper cladding is provided on the resultant structure and exposed through ultraviolet exposure mask 22.

Once the uncured upper cladding is removed from the region 4 (FIG. 3K), the lid 44 is clearly exposed and can be easily removed thereby leaving exposed and providing access to the surface mounted electric components 14. Since during the manufacture of the optical layers, the electrical SMDs are shielded, directly in this case, from exposure to the optical materials, there is no contamination of the electrical SMDs and so their function will not be deleteriously affected by the formation of the optical layers.

FIGS. 4A to 4D show selective steps from a further example of a method of making an EOPCB 2. Since many of the steps are the same as used in the methods described above with reference to FIGS. 2 and 3, a detailed description of a number of the steps will be omitted.

Figure 4A:
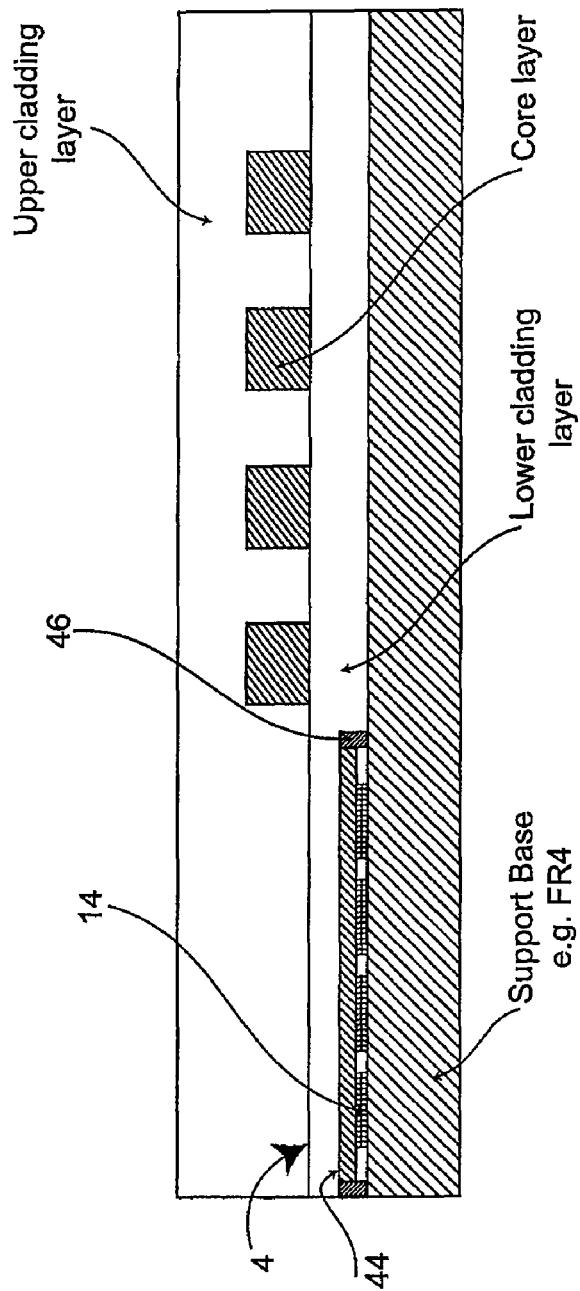
FIGS. 4A to 4D show the steps in the manufacture of a hybrid electro-optic printed circuit board.

Referring to FIG. 4A, initially, a detachable cover 44 is provided over the electrical SMDs 14. In this example, edge sections 46 are also provided to ensure that no optical material can access the electrical SMDs 14. In the example shown in FIG. 4A, no mask is used in the formation of upper and lower cladding layers. Thus, the cladding layers cover the entire structure shown in FIG. 4A. Therefore, to enable removal of the detachable lid 44 and subsequent exposure of the electrical SMDs 14, a cutting device is required to cut through the upper and lower cladding layers within the region 4.

Figure 4B:
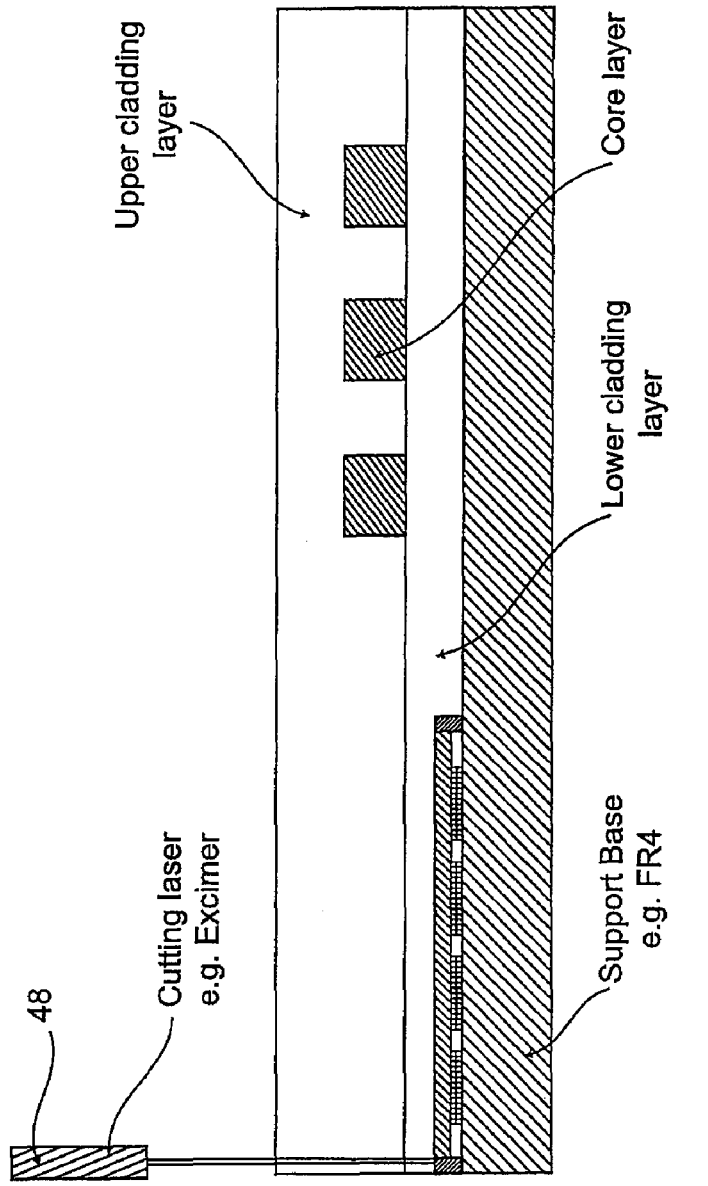

Referring to FIG. 4B, a particular example of a cutting device comprising a cutting laser head 48 is shown, e.g. an excimer laser. Any suitable cutting device could be used. The laser is used to cut around the fixed boundary section to enable removal of the detachable lid from the clear-out region 4.

Figure 4C:
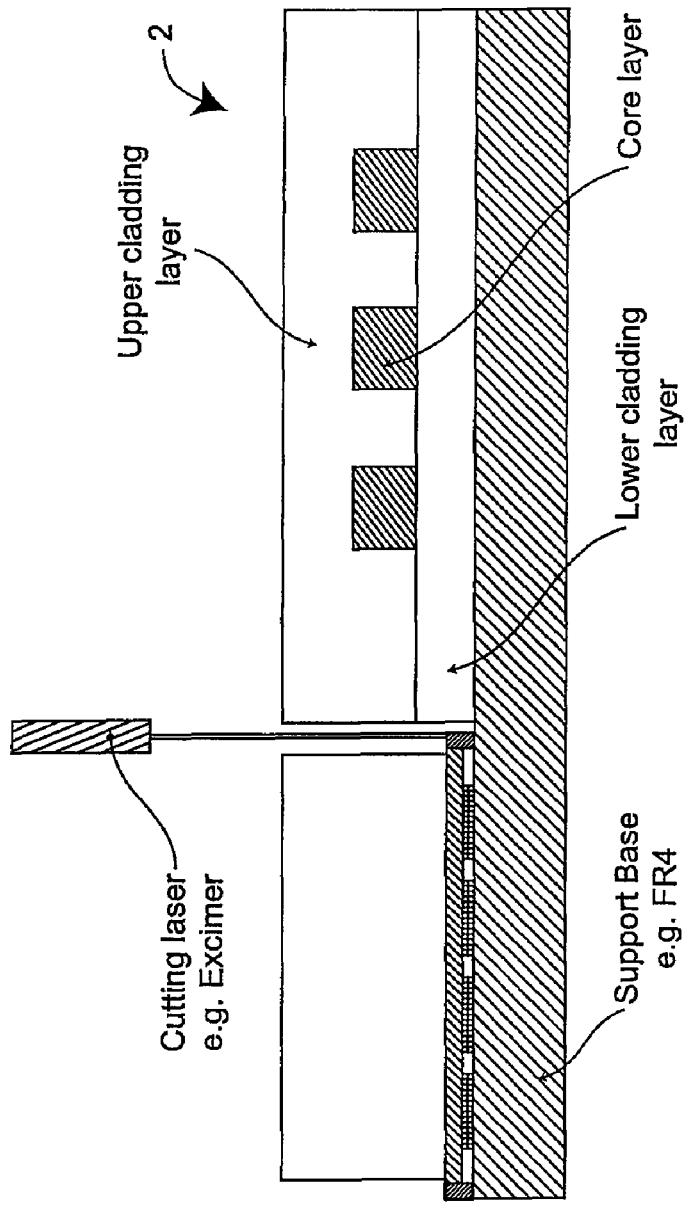
Figure 4D:
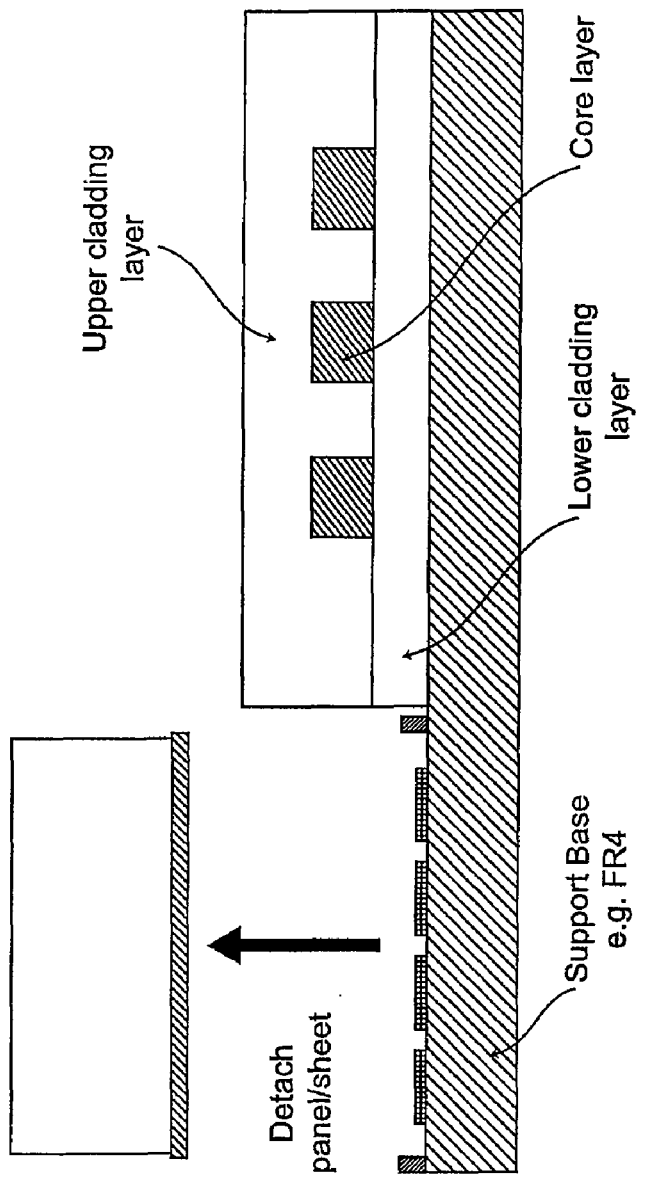

As shown in FIG. 4C, the laser 48 has effectively completed the cutting around the region 4 such that the lid 44 can be easily removed. Since the upper and lower cladding layers are hardened on the detachable lid 44, they function as a connector to enable removal of the lid 44. Thus, no additional connector such as that shown first in FIG. 3C, is required.

In all the examples shown above and described with reference to the accompanying drawings, a method of making an EOPCB 2 is disclosed in which during the formation of one or more surface mounted optical components, a region 4 of the EOPCB 2 is shielded such that contamination with optical material of the surface mounted electric components 14 is avoided. Thus, a simple and convenient method of manufacturing an EOPCB 2 in which both electric and optical components are required on the surface, is provided.

Embodiments of the present invention have been described with particular reference to the examples illustrated. However, it will be appreciated that variations and modifications may be made to the examples described within the scope of the present invention.

The invention claimed is:

1. A method of making an electro-optical printed circuit board, the method comprising:
   providing a support layer having thereon surface mounted electric components within a region of the support layer;
   forming one or more surface mounted optical components on the surface of the electro-optical printed circuit board; and
   during formation of the one or more surface mounted optical components shielding the region of the electro-optical printed circuit board where the surface mounted electric components are or are to be located or formed,
   wherein the step of shielding comprises positioning on the one or more surface mounted electric components a removable barrier, and
   wherein the barrier comprises an adhesive-backed flexible sheet.

2. A method according to claim 1, wherein the step of shielding comprises:
   forming the optical components using a layer of liquid optical polymer and exposing the layer of liquid optical polymer to curing radiation through a mask to shield the region where the one or more surface mounted optical components are located.

3. A method according to claim 1, wherein the barrier comprises a rigid structure for removal once the optical components have been formed.

4. A blank for the formation of an electro-optical printed circuit board, the blank comprising:
   a PCB support layer having an upper surface;
   surface mounted electrical components formed on the upper surface of the PCB support layer;
   one or more clear regions on the upper surface of the PCB support layer for the formation of optical components; and
   a barrier provided over the electrical components,
   wherein the barrier comprises a sheet removably mounted on the PCB support to enclose the surface mounted electrical components, and
   wherein the sheet is an adhesive-backed flexible sheet.

5. A blank according to claims 4, wherein the electrical components are arranged in as few continuous regions as possible.

* * * * *